United States Patent
Booth, Jr. et al.

(10) Patent No.: US 8,232,162 B2
(45) Date of Patent: Jul. 31, 2012

(54) FORMING IMPLANTED PLATES FOR HIGH ASPECT RATIO TRENCHES USING STAGED SACRIFICIAL LAYER REMOVAL

(75) Inventors: Roger A. Booth, Jr., Wappingers Falls, NY (US); Kangguo Cheng, Schenectady, NY (US); Joseph Ervin, Wappingers Falls, NY (US); Chengwen Pei, Danbury, CT (US); Ravi M. Todi, Poughkeepsie, NY (US); Geng Wang, Stormville, NY (US); Yanli Zhang, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 152 days.

(21) Appl. No.: 12/880,419

(22) Filed: Sep. 13, 2010

(65) Prior Publication Data
US 2012/0064694 A1   Mar. 15, 2012

(51) Int. Cl.
*H01L 21/8242* (2006.01)
(52) U.S. Cl. ........ 438/243; 438/246; 438/386; 438/389; 438/519; 257/E21.651
(58) Field of Classification Search .......... 438/243–244, 438/246–247, 386, 389–392, 514, 519, 521; 257/E21.651
See application file for complete search history.

(56) References Cited

U.S. PATENT DOCUMENTS

| | | | |
|---|---|---|---|
| 5,662,768 A | 9/1997 | Rostoker | |
| 5,753,558 A | 5/1998 | Akram et al. | |
| 5,943,581 A | 8/1999 | Lu et al. | |
| 6,281,069 B1 | 8/2001 | Wu et al. | |
| 6,339,241 B1 | 1/2002 | Mandelman et al. | |
| 6,784,477 B2 | 8/2004 | Jang | |
| 6,964,897 B2 | 11/2005 | Bard et al. | |
| 7,232,718 B2 | 6/2007 | Chang et al. | |
| 7,408,214 B2 | 8/2008 | Bulsara et al. | |
| 7,563,671 B2 | 7/2009 | Su et al. | |
| 7,655,967 B2 | 2/2010 | Cheng et al. | |
| 7,674,675 B2 | 3/2010 | Berndlmaier et al. | |
| 2005/0020008 A1* | 1/2005 | Moumen | 438/248 |

* cited by examiner

*Primary Examiner* — Thanhha Pham
(74) *Attorney, Agent, or Firm* — Cantor Colburn LLP; Joseph Petrokaitis

(57) ABSTRACT

A method of forming a deep trench structure for a semiconductor device includes forming a mask layer over a semiconductor substrate. An opening in the mask layer is formed by patterning the mask layer, and a deep trench is formed in the semiconductor substrate using the patterned opening in the mask layer. A sacrificial fill material is formed over the mask layer and into the deep trench. A first portion of the sacrificial fill material is recessed from the deep trench and a first dopant implant forms a first doped region in the semiconductor substrate. A second portion of the sacrificial fill material is recessed from the deep trench and a second dopant implant forms a second doped region in the semiconductor substrate, wherein the second doped region is formed underneath the first doped region such that the second doped region and the first doped region are contiguous with each other.

20 Claims, 12 Drawing Sheets

FORMING IMPLANTED PLATES FOR HIGH ASPECT RATIO TRENCHES USING STAGED SACRIFICIAL LAYER REMOVAL

BACKGROUND

The present invention relates generally to semiconductor device processing techniques and, more particularly, to a method of forming implanted plates for high aspect ratio trenches for semiconductor devices using staged sacrificial layer removal.

Deep trench capacitors are used in a variety of semiconductor chips for high area capacitance and low device leakage. Typically, a deep trench capacitor provides a capacitance in the range from about 4 fF (femto-Farad) to about 120 fF. A deep trench capacitor may be employed as a charge storage unit in a dynamic random access memory (DRAM), which may be provided as a stand-alone semiconductor chip, or may be embedded in a system-on-chip (SoC) semiconductor chip. A deep trench capacitor may also be employed in a variety of circuit applications such as a charge pump or a capacitive analog component in a radio frequency (RF) circuit.

Deep trench capacitors are formed in a semiconductor substrate, which can be a semiconductor-on-insulator (SOI) substrate or a bulk substrate. Other semiconductor devices such as field effect transistors (FETs) can be formed on the same semiconductor substrate, thereby enabling embedding of deep trench capacitors into a semiconductor chip. Such embedded deep trench capacitors enable various functionalities including, for example, embedded dynamic access memory (eDRAM) and other embedded electronic components requiring a capacitor.

As the size of an opening of a deep trench decreases with integrated circuit device scaling, the aspect ratio of the deep trench increases. Thus, formation of a buried plate by angled ion implantation into sidewalls of a deep trench becomes more difficult with the increase in the aspect ratio of the deep trench. There are two factors that render the formation of a buried plate by direct angled ion implantation into sidewalls of the deep trench difficult. First, a high aspect ratio of a deep trench limits the amount of implanted ions that can reach a lower portion of the deep trench, as even a small angular variation from normal incidence in the direction of the implanted ions tends to send the ions to the upper portion of the deep trench when the aspect ratio is high. Second, a spacer layer is typically used upon formation of a deep trench in order to absorb implanted ions and protect the top semiconductor layer in an SOI substrate or a top portion of a bulk substrate during ion implantation. However, such a spacer layer reduces the dimension of the opening in the upper portion of the deep trench, thus limiting the ion implantation angle even further.

On the other hand, there also exist methods of forming a trench plate without ion implantation such as, for example, gas phase doping, solid source doping, and depositing a metal plate. Still another approach involves utilizing an already doped handle wafer to serve as a pre-doped plate for the deep trenches, and growing epitaxial layer on the handle wafer, sandwiching a buried insulator layer. Unfortunately, such alternate methods tend to employ complex processing schemes and are also costly to implement.

SUMMARY

In an exemplary embodiment, a method of forming a deep trench structure for a semiconductor device includes forming a mask layer over a semiconductor substrate; forming an opening in the mask layer by patterning the mask layer; forming a deep trench in the semiconductor substrate using the patterned opening in the mask layer; forming a sacrificial fill material over the mask layer and into the deep trench; recessing a first portion of the sacrificial fill material from the deep trench and performing a first dopant implant to form a first doped region in the semiconductor substrate; and recessing a second portion of the sacrificial fill material from the deep trench and performing a second dopant implant to form a second doped region in the semiconductor substrate, wherein the second doped region is formed underneath the first doped region such that the second doped region and the first doped region are contiguous with each other.

In another embodiment, a method of forming a deep trench structure for a semiconductor device includes forming a mask layer over a semiconductor-on-insulator (SOI) substrate having a bottom semiconductor layer, a buried insulator layer on the bottom semiconductor layer, and a top semiconductor layer on the buried insulator layer; forming an opening in the mask layer by patterning the mask layer; forming a deep trench in the SOI substrate using the patterned opening in the mask layer; forming a sacrificial fill material over the mask layer and into the deep trench; recessing a first portion of the sacrificial fill material from the deep trench and performing a first dopant implant to form a first doped region in the bottom semiconductor layer of the SOI substrate; recessing a second portion of the sacrificial fill material from the deep trench and performing a second dopant implant to form a second doped region in the bottom semiconductor layer, wherein the second doped region is formed underneath the first doped region such that the second doped region and the first doped region are contiguous with each other; and annealing the semiconductor SOI to create a single contiguous doped region with a smoothed dopant profile.

BRIEF DESCRIPTION OF THE SEVERAL VIEWS OF THE DRAWINGS

Referring to the exemplary drawings wherein like elements are numbered alike in the several Figures:

FIGS. 1 through 11 are a sequence of cross sectional views illustrating a method of forming implanted plates for high aspect ratio trenches for semiconductor devices in accordance with an embodiment of the invention, in which:

FIG. 1 illustrates the formation of a mask layer over an SOI substrate;

FIG. 2 illustrates the formation of a deep trench through the mask layer and SOI substrate;

FIG. 3 illustrates the formation of a protective spacer layer inside the deep trench;

FIG. 4 illustrates the formation of a sacrificial fill material within the deep trench;

FIG. 5 illustrates the removal of a first portion of the sacrificial fill material within the deep trench;

FIG. 6 illustrates a first ion implantation of dopant material within the deep trench;

FIG. 7 illustrates a second ion implantation of dopant material within the deep trench following the removal of a second portion of the sacrificial fill material;

FIG. 8 illustrates a third ion implantation of dopant material within the deep trench following the removal of a third portion of the sacrificial fill material;

FIG. 9 illustrates a fourth ion implantation of dopant material within the deep trench following the removal of a fourth portion of the sacrificial fill material;

FIG. 10 illustrates the removal of remaining portions of the sacrificial fill material within the deep trench;

FIG. 11 illustrates activation of the dopant material by thermal processing.

DETAILED DESCRIPTION

Disclosed herein is a method of forming implanted plates for high aspect ratio trenches for semiconductor devices using staged sacrificial layer removal. In this manner, targeted implants may be achieved as the lateral straggle allows the dopant material into the semiconductor sidewalls, as portions of the sacrificial layer are successively removed.

Figure 1:
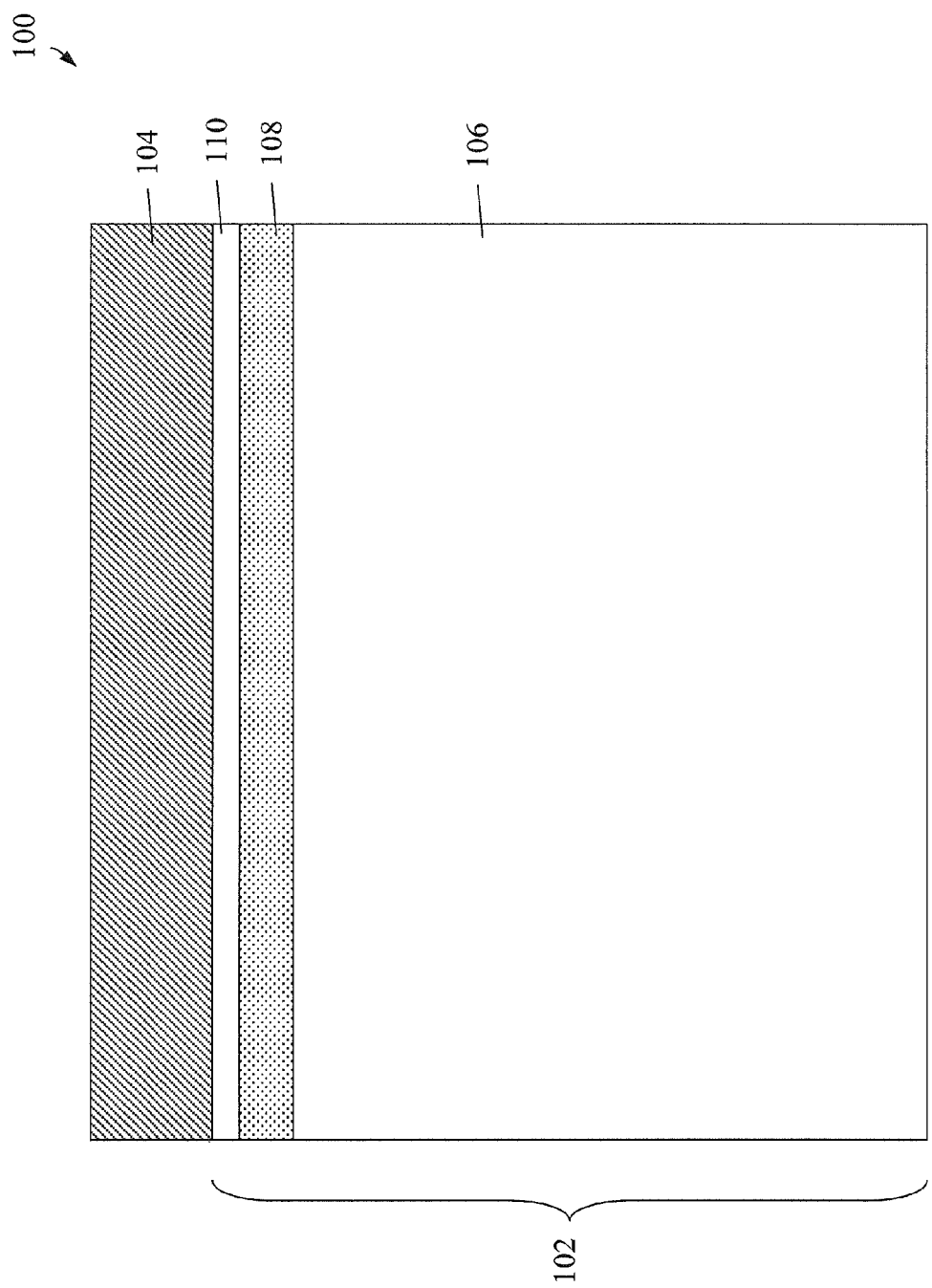

Referring initially to FIG. 1, there is shown an exemplary semiconductor structure 100 suitable for use in accordance with an embodiment of the present invention. The structure 100 includes a semiconductor-on-insulator (SOI) substrate 102 having a mask layer 104 formed on a top surface thereupon. The SOI substrate 102 is a semiconductor substrate that includes at least one semiconductor material portion. More specifically, the SOI substrate 102 includes, from bottom to top, a bottom or bulk semiconductor layer 106, a buried insulator layer 108, and a top semiconductor layer 110. The semiconductor material used for the top semiconductor layer 110 and the semiconductor material used for the bottom semiconductor layer 106 may be the same, or different. Exemplary semiconductor materials for the top semiconductor layer 110 and the bottom semiconductor layer 106 include, but are not limited to, silicon, a germanium, silicon-germanium alloy, a silicon carbon alloy, a silicon-germanium-carbon alloy, gallium arsenide, indium arsenide, indium phosphide, III-V compound semiconductor materials, II-VI compound semiconductor materials, organic semiconductor materials, and other compound semiconductor materials.

In addition, the top semiconductor layer 110 and bottom semiconductor layer 106 may be a single crystalline material having an epitaxial alignment throughout the entirety thereof. However, embodiments in which the top semiconductor layer 110 and/or the bottom semiconductor layer 106 include at least one polycrystalline or amorphous semiconductor material are also contemplated as well. The bottom semiconductor layer 106 has a doping of a first conductivity type at an exemplary dopant concentration from about $1.0 \times 10^{14}$ atoms/cm$^3$ to about $1.0 \times 10^{19}$ atoms/cm$^3$, and more specifically from about $1.0 \times 10^{14}$ atoms/cm$^3$ to about $1.0 \times 10^{17}$ atoms/cm$^3$. It should be noted at this point that although the present embodiments are described with an SOI substrate 102, the principles herein are also applicable to an SOI portion of a hybrid substrate. Regardless, an exemplary thickness of the top semiconductor layer 110 may be from about 10 nanometers (nm) to about 500 nm, and more specifically from about 30 nm to 100 nm, although lesser and greater thicknesses are contemplated herein also.

The buried insulator layer 108 vertically contacts a top surface of the bottom semiconductor layer 106 and a bottom surface of the top semiconductor layer 110. The buried insulator layer 108 includes a dielectric material such as, for example, silicon oxide, silicon nitride, silicon oxynitride, or a stack thereof. In one specific example, the buried insulator layer 108 comprises silicon oxide. An exemplary thickness of the buried insulator layer 108 may be from about 10 nm to about 500 nm, and more specifically from about 60 nm to about 300 nm, although lesser and greater thickness are contemplated herein also.

The mask layer 104 formed on the top surface of the top semiconductor layer 110 may include, for example, a dielectric oxide, a dielectric nitride, a dielectric oxynitride, or a combination thereof. A dielectric oxide, where used may be an undoped silicate glass or a doped silicate glass such as borosilicate glass (BSG), borophosphosilicate glass (BPSG), phosphosilicate glass (PSG), a fluorosilicate glass (FSG), or a combination thereof. Examples of the dielectric nitride and the dielectric oxynitride include silicon nitride and silicon oxynitride. Further, the mask layer 104 may include a stack of a silicon oxide layer (not shown separately) contacting a top surface of the top semiconductor layer 110 and a silicon nitride layer (not shown separately) located directly on the silicon oxide layer. The mask layer 104 may be formed by chemical vapor deposition (CVD) such as low pressure chemical vapor deposition (LPCVD), rapid thermal chemical vapor deposition (RTCVD), plasma enhanced chemical vapor deposition (PECVD), high density plasma chemical vapor deposition (HDPCVD), etc. The thickness of the mask layer 104 may be from about 500 nm to about 3000 nm, and more specifically from about 800 nm to about 1500 nm, although lesser and greater thicknesses can also be employed.

Figure 2:
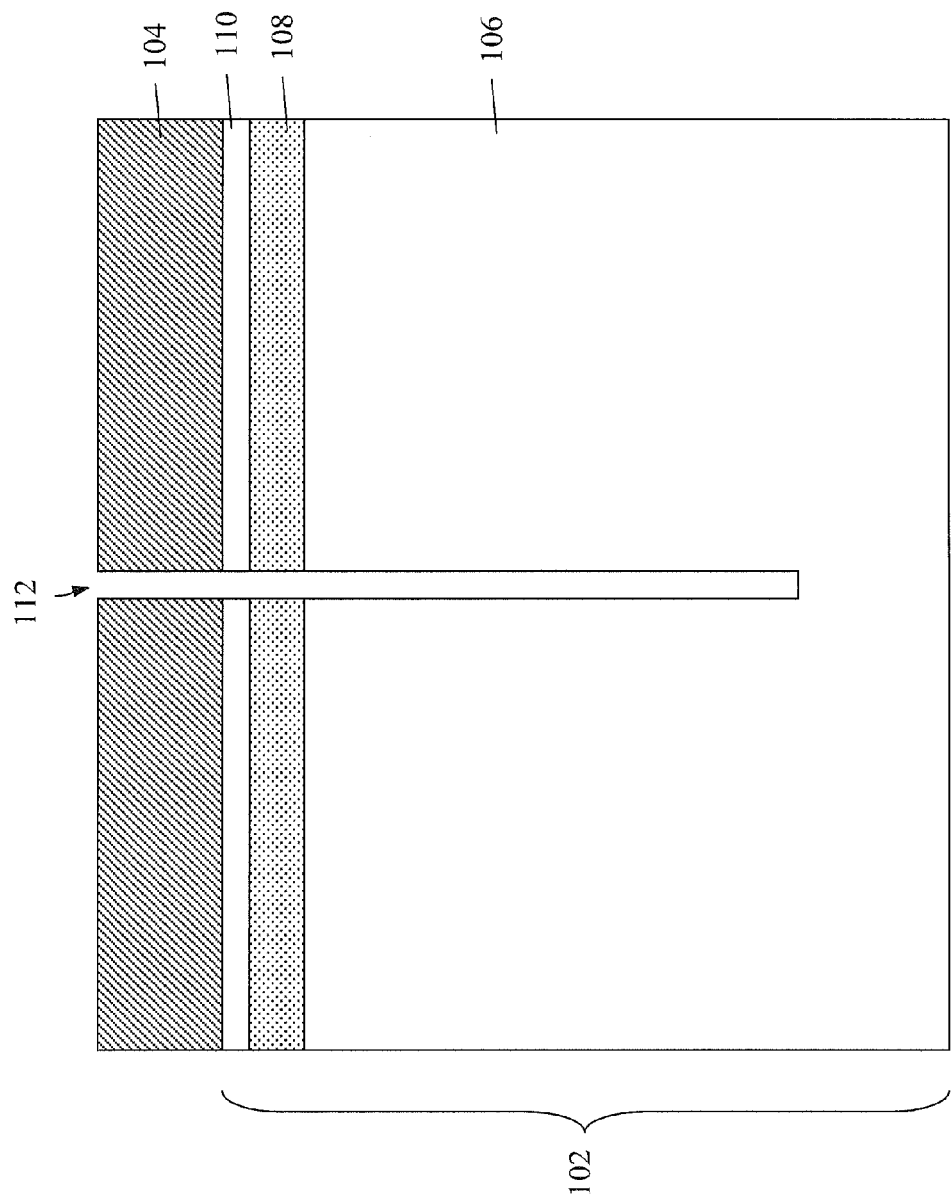

FIG. 2 illustrates the formation of a deep trench 112 through the mask layer 104 and SOI substrate 102. The deep trench 112 is formed by application of a photoresist layer (not shown) over the mask layer 104. A lithographic pattern including one or more openings is formed in the photoresist by lithographic exposure and development. The horizontal cross-sectional shape of each opening may be a circle, an ellipse, a polygon, or a derivative a polygon derived by rounding corners thereof. A characteristic lateral dimension of the shape of each opening is limited by the printing capability of a lithographic tool employed to pattern the opening. The characteristic lateral dimension can be a diameter of a circle, a minor axis of an ellipse, a distance between two facing sides of a polygon or a derivative thereof, or a distance that can otherwise characterize a separation distance between different sides of the shape.

The pattern of each opening formed in the photoresist is then transferred by an anisotropic etch into the mask layer 104, during which the photoresist serves as an etch mask. The photoresist may be subsequently removed selective to the mask layer 104, for example, by ashing. Optionally, the pattern in the mask layer 104 may be further transferred into and through the top semiconductor layer 110, into and through the buried insulator layer 108, and into the bottom semiconductor layer 106 by one or more additional anisotropic etches so as to form the deep trench 112. If the pattern in the mask layer 104 is transferred into the top semiconductor layer 110 before removal of the photoresist, the photoresist functions an etch mask. On the other hand, if the pattern in the mask layer 104 is transferred into the top semiconductor layer 110 after removal of the photoresist, then the mask layer 104 functions an etch mask.

Figure 3:
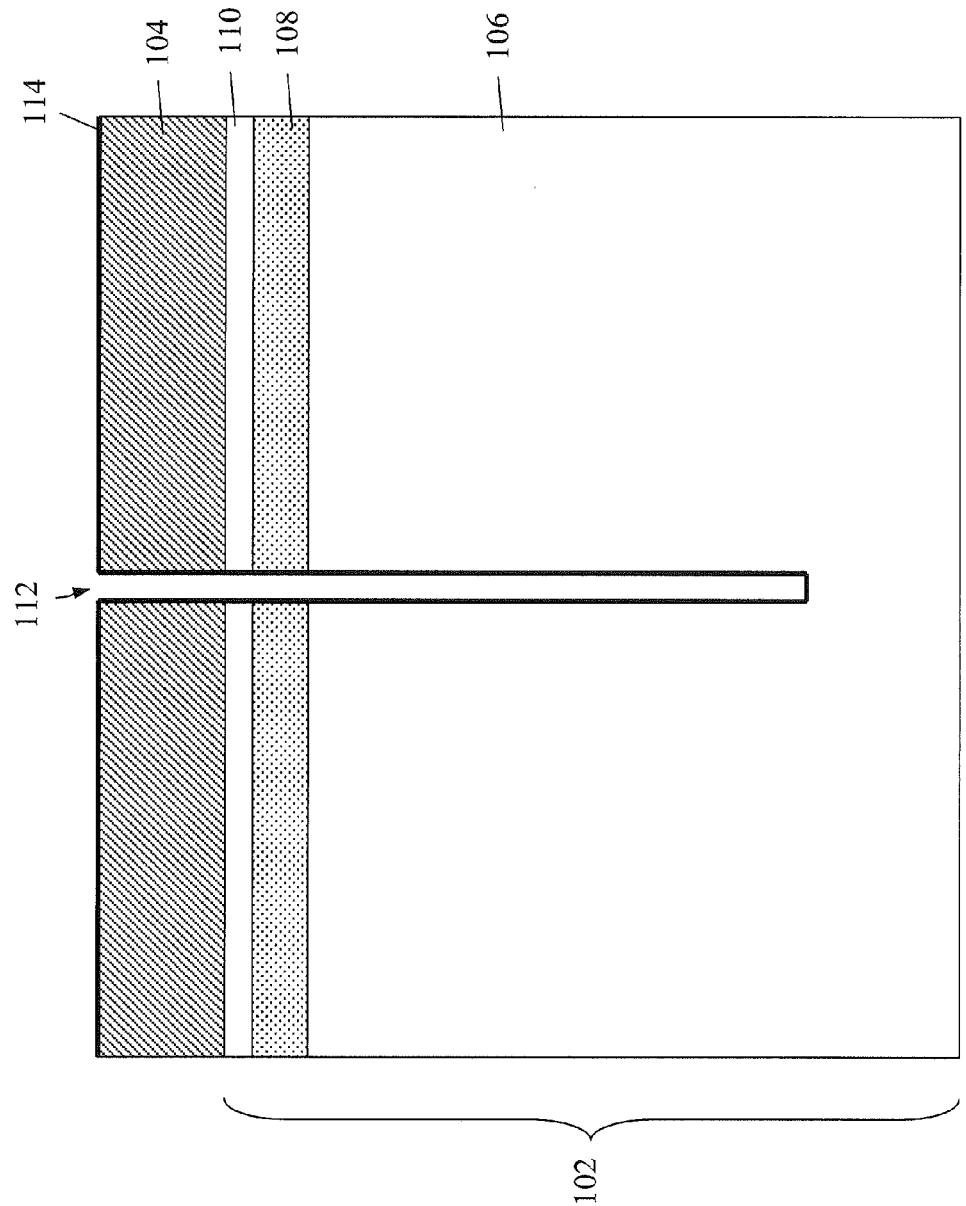

As shown in FIG. 3, a protective spacer layer 114 is formed on the top of the mask layer 104 and along the sidewall and bottom surfaces of the deep trench 112. In particular, the spacer layer 114 protects the top semiconductor layer 110 during subsequent dopant implantation processes. The spacer layer 114 may be, for example, an oxide layer.

Figure 4:
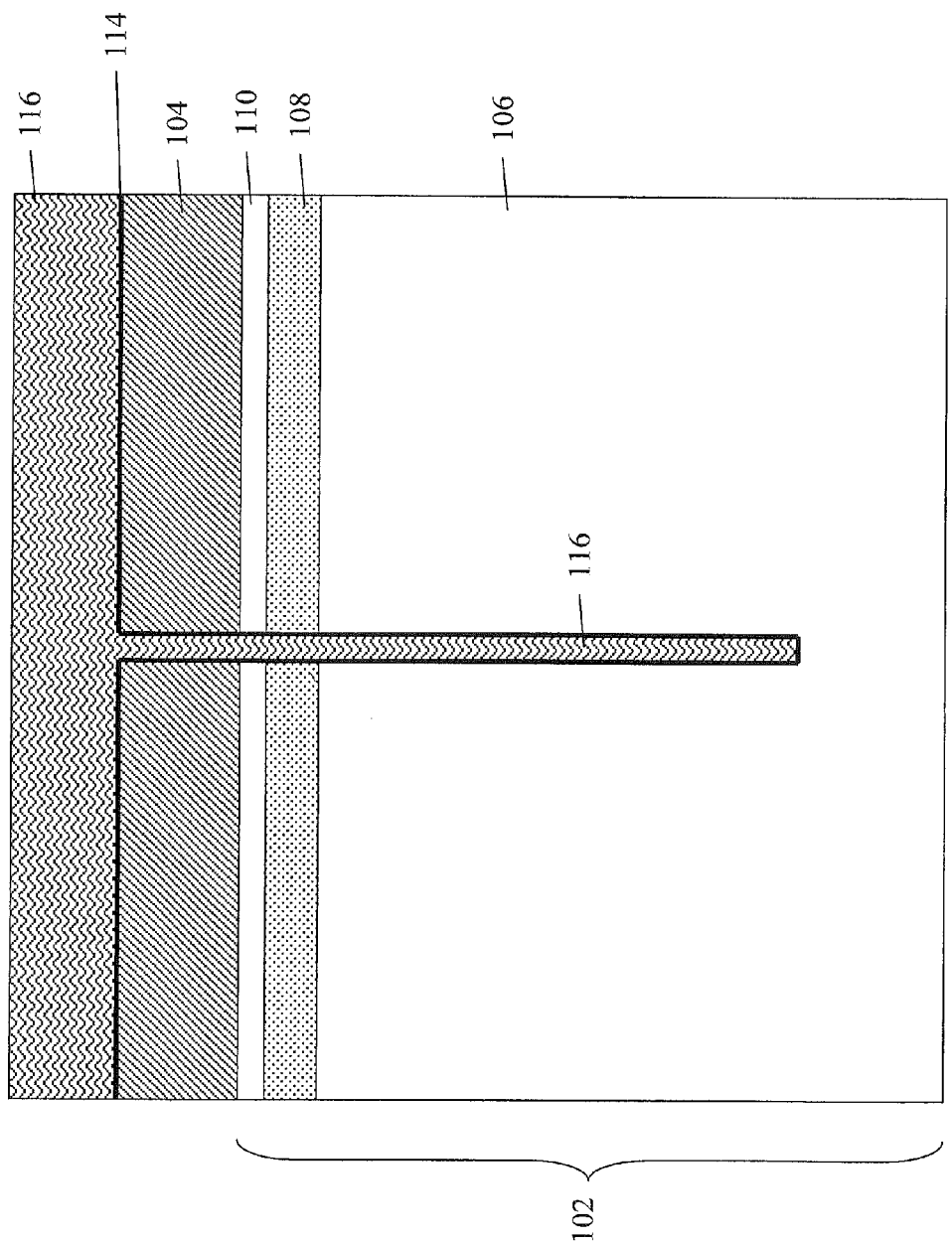
Figure 5:
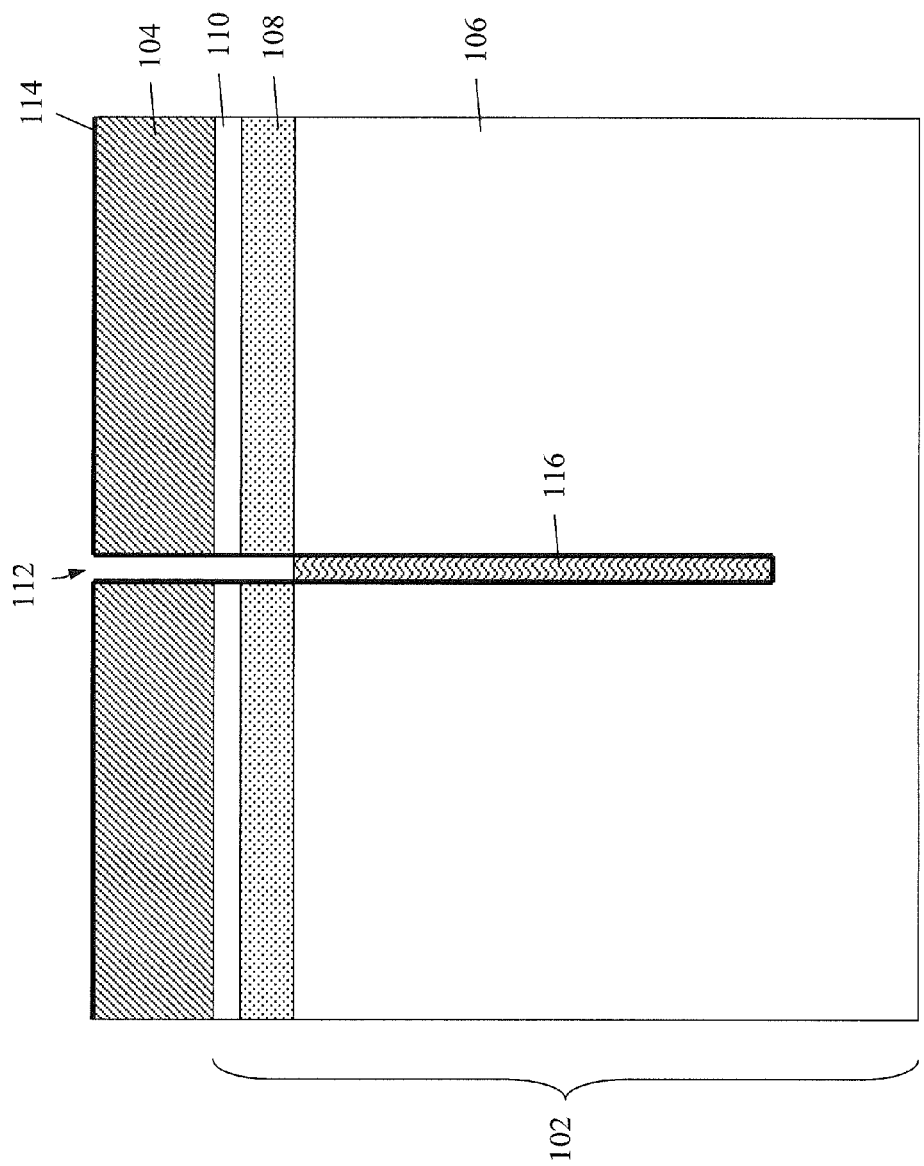
Figure 6:
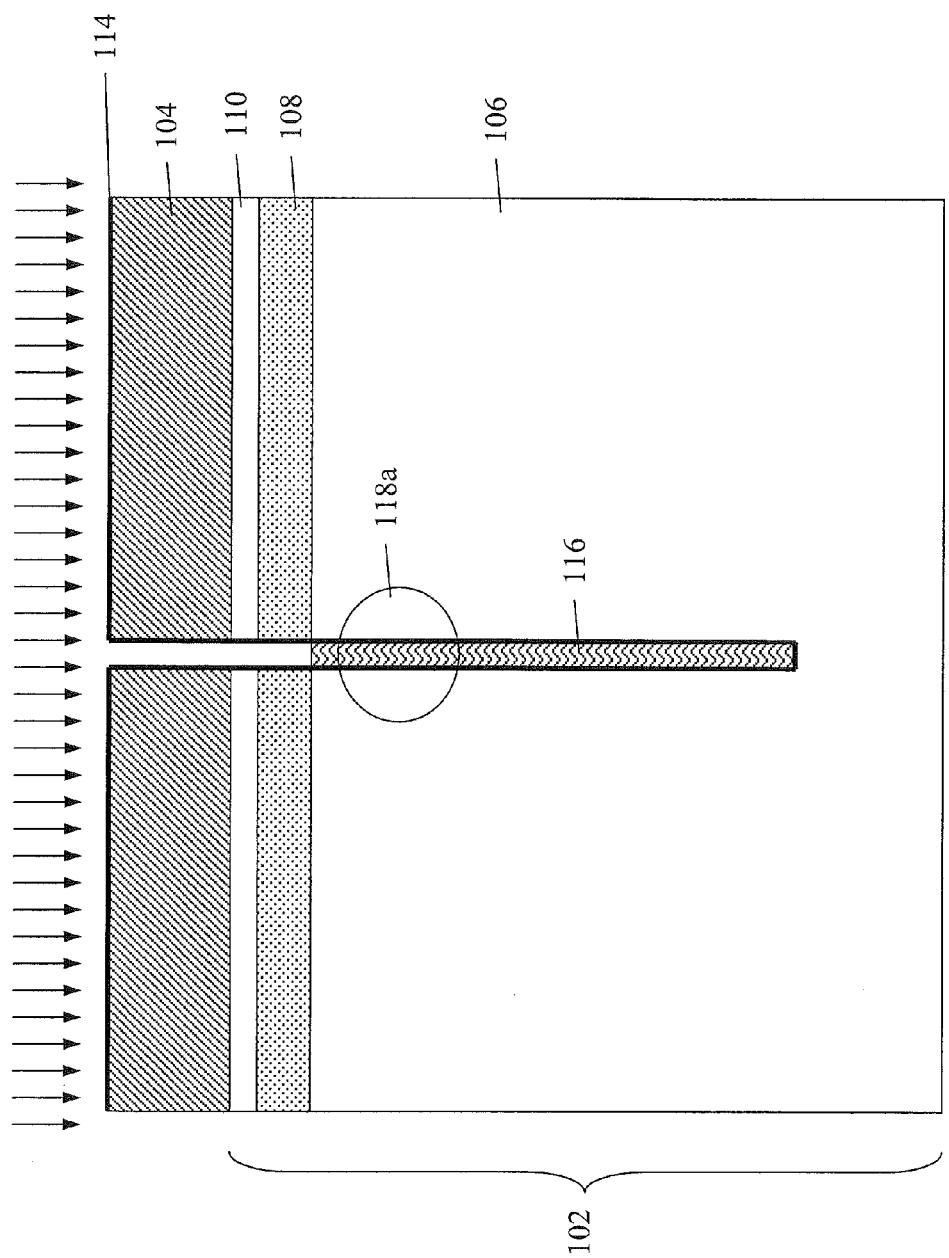

Referring now to FIG. 4, the deep trench 112 is filled with a sacrificial fill material 116, such as a photoresist layer or an organic planarization layer (OPL). Once the deep trench 112 is completely filled with the sacrificial fill material 116, an etch process is used to selectively recess portions of the fill material 116 in stages. A first such recess etch process is illustrated in FIG. 5. Here, a first portion of the sacrificial fill material 116 within the deep trench 112 is removed, down to a level approximately corresponding to the top surface of the bottom semiconductor layer 106. At this point, a first vertical ion implantation is performed, as indicated by the arrows in FIG. 6.

The dopant ions are ions of dopant atoms or dopant molecules that can generate holes or electrons in the semiconductor material of the bottom semiconductor layer 106. For example, the first dopant ions may be ions of boron (B), gallium (Ga), indium (In), phosphorus (P), arsenic (As), antimony (Sb), or ions of a compound including at least one of B, Ga, In, P, As, Sb and at least another element. An exemplary compound including B is boron difluoride ($BF_2$).

The polarity of the dopant ions is selected to be opposite of the doping type of the bottom semiconductor layer 106. For example, if the bottom semiconductor layer 10 includes a p-doped semiconductor material, ions including n-type dopants such as P, As, and Sb are employed in the dopant ion implantation. Conversely, if the bottom semiconductor layer 10 includes an n-doped semiconductor material, ions including p-type dopants such as B, Ga, and In are employed in the first dopant ion implantation step.

The dopant ions are implanted in a direction that is normal to a top surface of the SOI substrate 102. While the implant angle, i.e., the angle between the impinging dopant ions and the surface normal of the SOI substrate 102, is nominally zero, non-substantial deviations from normal incidence can be practiced for the dopant ion step to minimize any adverse effect of channeling of ions as needed. The deviation of the implant angle from the surface normal of the SOI substrate 102 is limited by the quantity of dopant ions to be implanted into the bottom semiconductor layer 106.

As a result of the first implantation process, a first doped region 118*a* is formed in the bottom semiconductor layer 106. In the first ion implantation process, the ions may be implanted employing a single ion implantation step at a target ion implantation energy and a target dose, or can be implanted employing multiple ion implantation steps each having a different target ion implantation energy and a target dose. If multiple ion implantation steps having different ion energies are employed, the dopant profile after the multiple ion implantation steps is the superposition of all individual ion implantation steps. The target ion implantation energy may be from, for example about 20 (kilo electron volts) keV to about 1 MeV (mega electron volt), and more specifically from about 300 keV to about 1 MeV, although lesser and greater target ion implantation energies can also be employed. It should be noted that the mask layer 104 has a thickness sufficient to prevent implantation of the dopant ions into the top semiconductor layer 110. That is, the thickness of the mask layer 104 is greater than distance between the top surface of the bottom semiconductor layer 106 and the bottommost point of the first doped region 118*a*.

Figure 7:
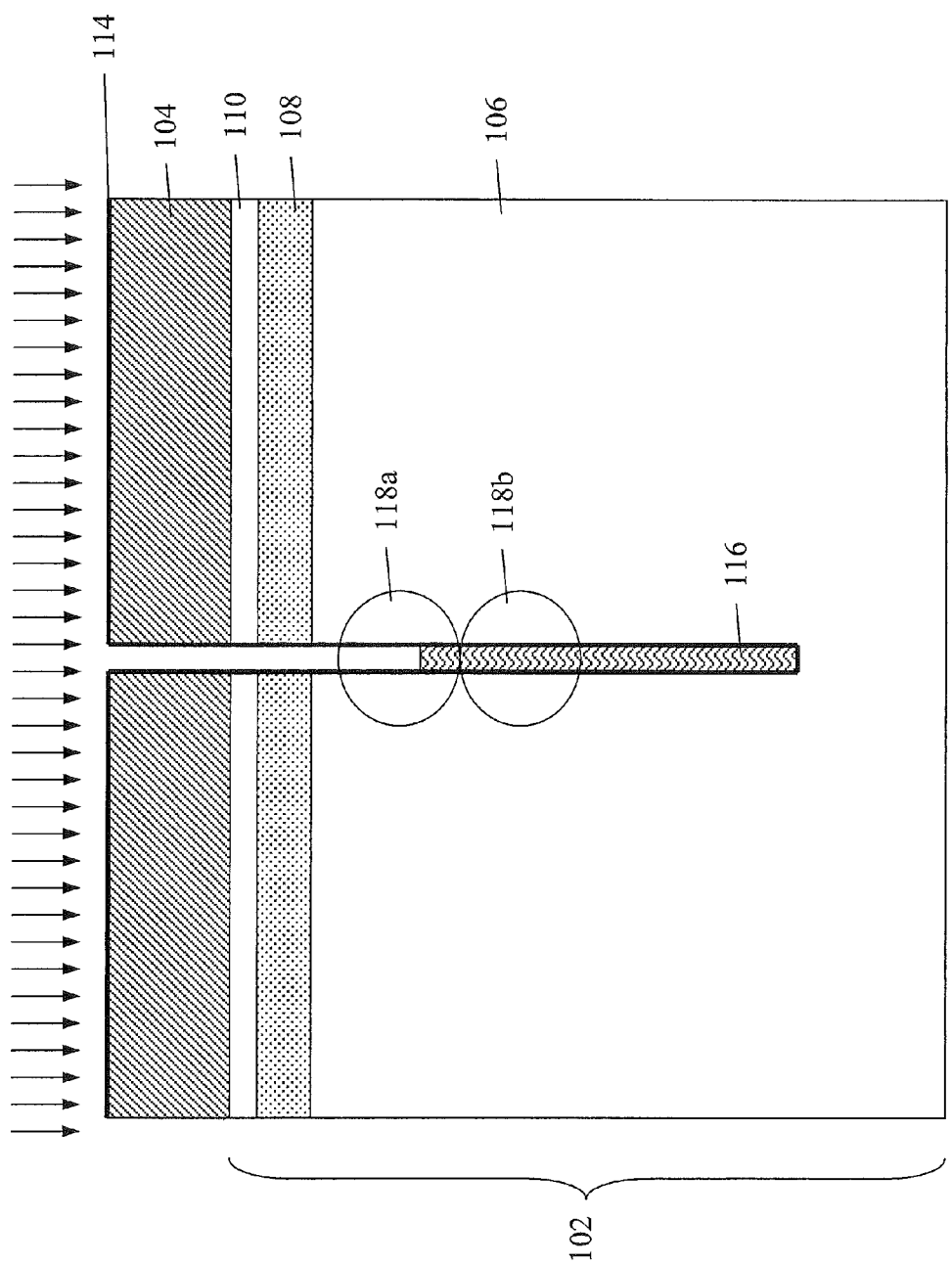

Proceeding to FIG. 7, a second ion implantation of dopant material within the deep trench 112 is performed following the removal of a second portion of the sacrificial fill material 116. In so doing, the mask layer 104 continues to serve as an etch mask during the removal of the additional sacrificial fill material 116. The amount of additional sacrificial fill material 116 removed from the deep trench may correspond to about 1 micron (μm) of additional depth (and more generally from about 500 nm to about 2000 nm) such that the top surface of the remaining sacrificial fill material 116 is above the lowest point of the of the first doped region 118*a*. As also shown in FIG. 7, the second ion implantation results in the formation of a second doped region 118*b* beneath the first doped region 118*a*, wherein the second doped region 118*b* and the first doped region 118*a* are contiguous with each other.

The second dopant ions can be selected from the same ions that can be employed for the first dopant ions. The second dopant ions have the same polarity as the first dopant ions. For example, if the first dopant ions are ions of p-type dopants, the second dopant ions are also ions of p-type dopants. Conversely, if the first dopant ions are ions of n-type dopants, the second dopant ions are also ions of n-type dopants. In addition, the implant conditions for the second ion implantation process may be the same as for the first ion implantation process, including implantation angle and energy. Again, the mask layer 104 has a thickness sufficient to prevent implantation of the dopant ions into the top semiconductor layer 110.

Figure 8:
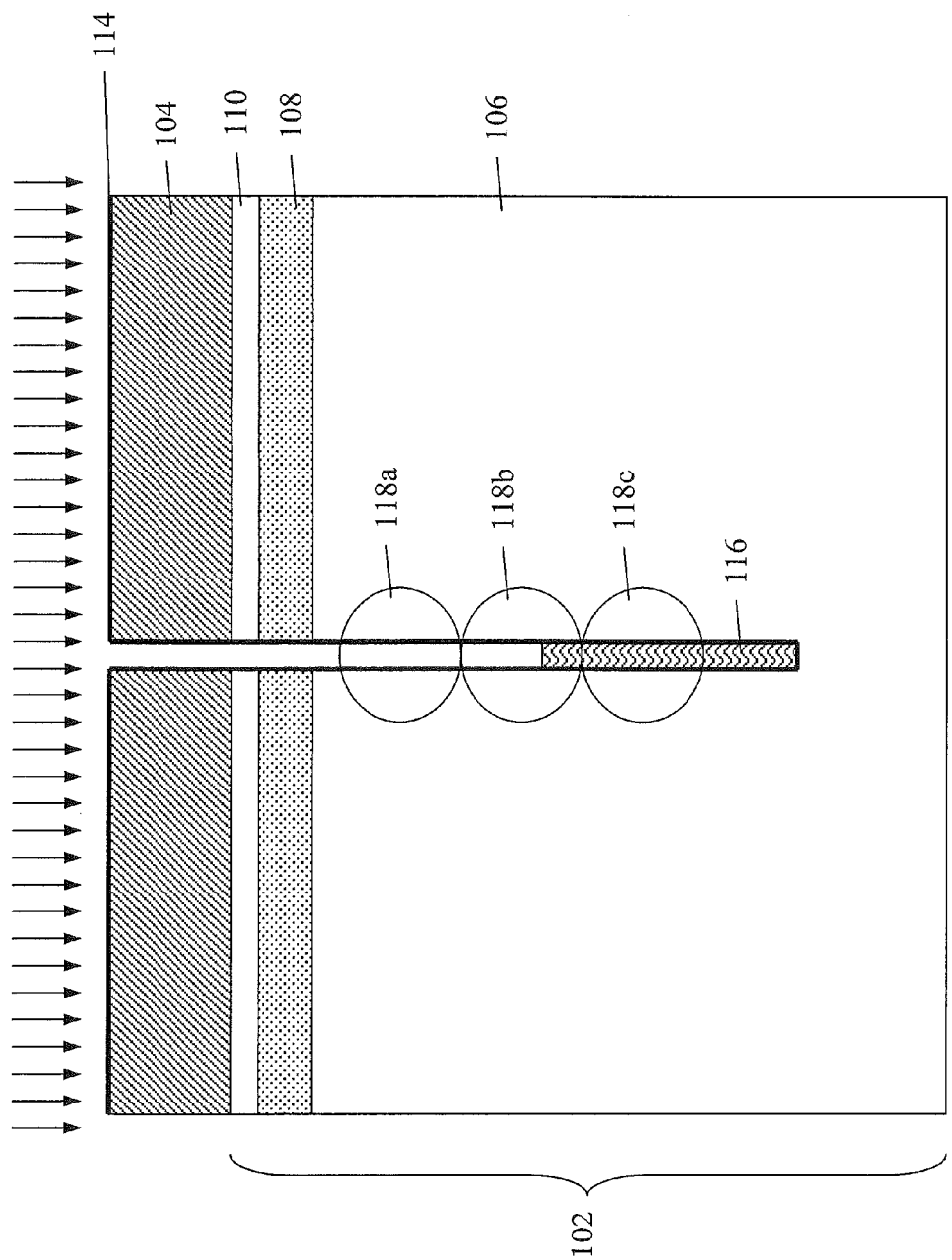

FIG. 8 illustrates a third ion implantation of dopant material within the deep trench 112 following the removal of a third portion of the sacrificial fill material 116. As is the case with the first two implantation processes, the mask layer 104 continues to serve as an etch mask during the removal of the additional sacrificial fill material 116, and to prevent implantation of the dopant ions into the top semiconductor layer 110. The amount of additional sacrificial fill material 116 removed from the deep trench may again correspond to about 1 μm of additional depth (and more generally from about 500 nm to about 2000 nm) such that the top surface of the remaining sacrificial fill material 116 is above the lowest point of the of the second doped region 118*b*. As also shown in FIG. 8, the third ion implantation results in the formation of a third doped region 118*c* beneath the second doped region 118*b*, wherein the third doped region 118*c* and the second doped region 118*b* are contiguous with each other.

Figure 9:
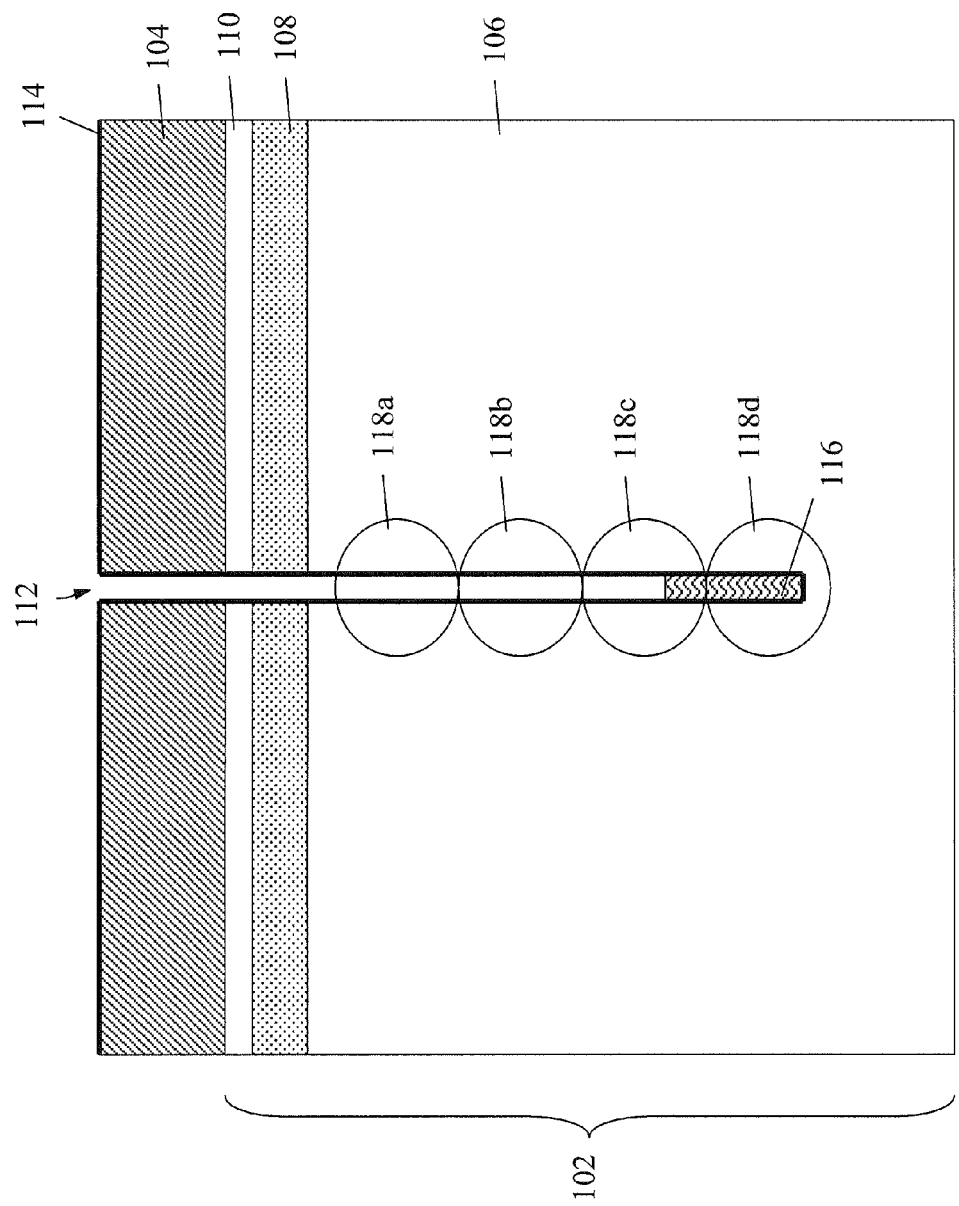

It should be appreciated that as the illustrative figures are not to scale, the above described sequence of processing steps may be repeated as many times as necessary to form successive, contiguous doped regions at sidewalls of the deep trench 112, as more sacrificial fill material 116 is successively removed from the deep trench 112. Generally stated, the recessing of a $n^{th}$ portion of the sacrificial fill material 116 is to a level above a lowest point of an $n^{th}$-doped region, where n is an integer. Thus, for example, FIG. 9 illustrates a fourth ion implantation of dopant material within the deep trench 112 following the removal of a fourth portion of the sacrificial fill material 116. This results in the formation of a fourth doped region 118*d* beneath the second doped region 118*c*, wherein the fourth doped region 118*d* and the third doped region 118*c* are contiguous with each other.

Figure 10:
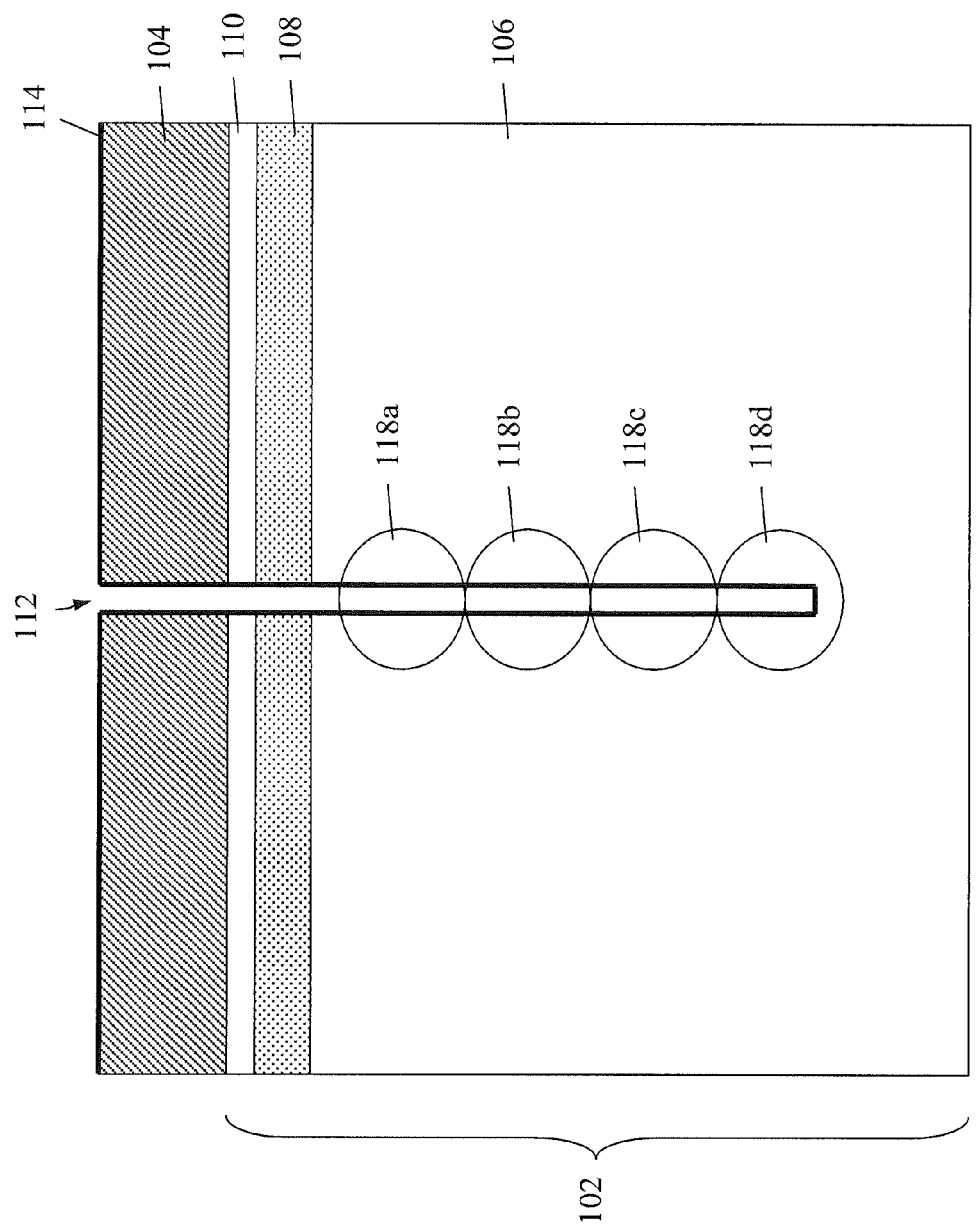
Figure 11:
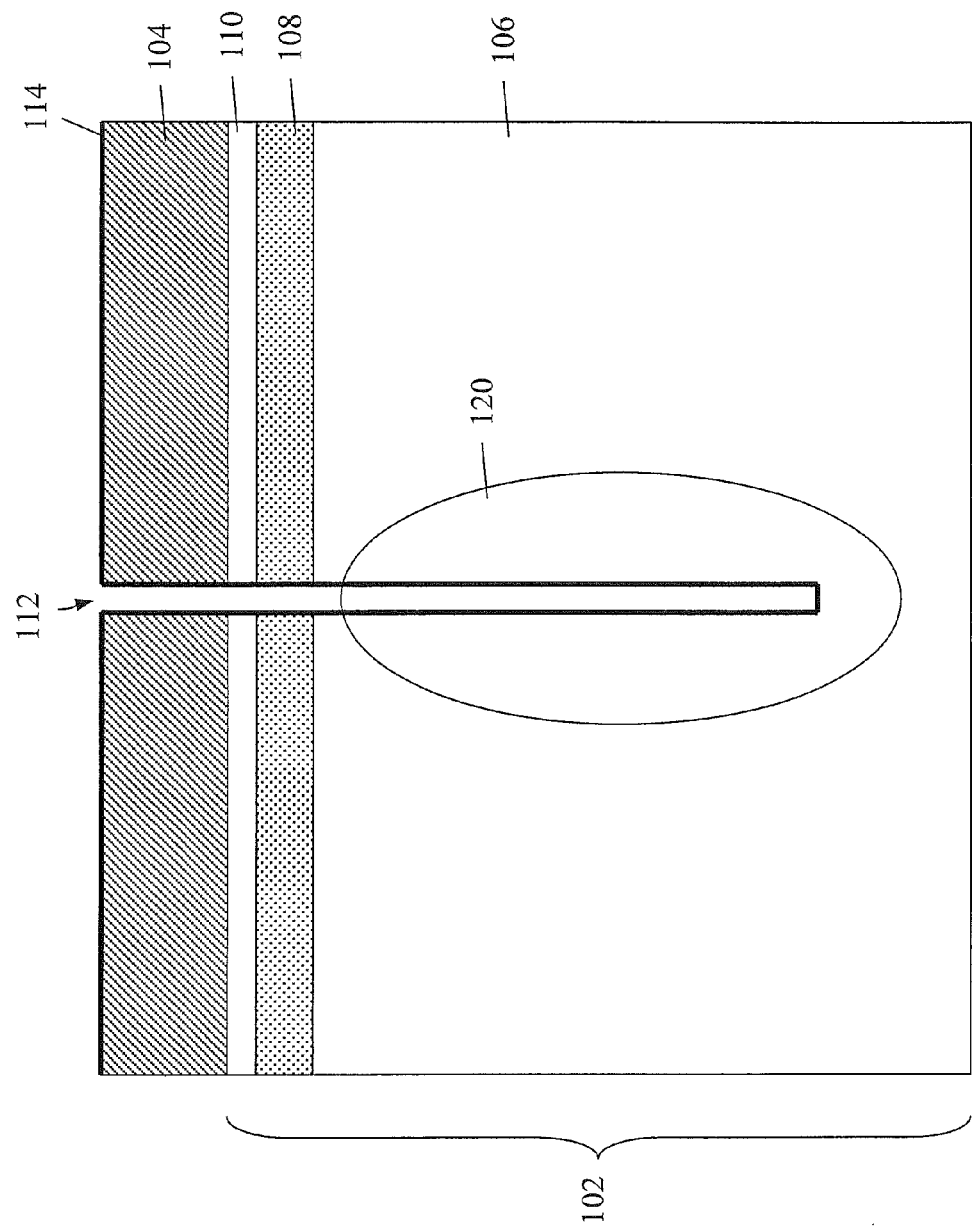

Once all desired implantation sequences are completed, the remaining portions of the sacrificial fill material 116 are then completely removed from the deep trench 112, as shown in FIG. 10. In one exemplary embodiment, the bottom surface of the deep trench 112 is located above the lowest point of the bottom most doped region, which in this example is the fourth doped region 118*d*. Then, as shown in FIG. 11, an activation anneal is performed to activate the implanted dopants in the contiguously doped regions 118*a* through 118*d*, thus forming a single contiguous doped region 120 with a smoothed dopant profile. During the activation anneal, dopant ions in interstitial sites are incorporated into substitutional sites to become electrically active. The temperature of the activation anneal may be from about 900° C. to about 1100° C., although lesser and greater activation anneal temperatures can also be employed. Surfaces of the resulting p-n junction between the contiguous doped region 120 and the bottom semiconductor layer 106 become smoother during the activation anneal. In a deep trench capacitor structure, the contiguous doped region 120 is also referred to as a buried plate.

From this point, conventional deep trench processing may continue to form additional structures associated with deep trench capacitors, as well as DRAM cells, such as node dielectric layers, trench electrodes, buried straps, and access field effect transistors, for example. It will be noted the spacer layer protective spacer layer 114 may either be used in whole or in part during subsequent processing or, alternatively, may be removed and replaced by another material.

Figure 12:
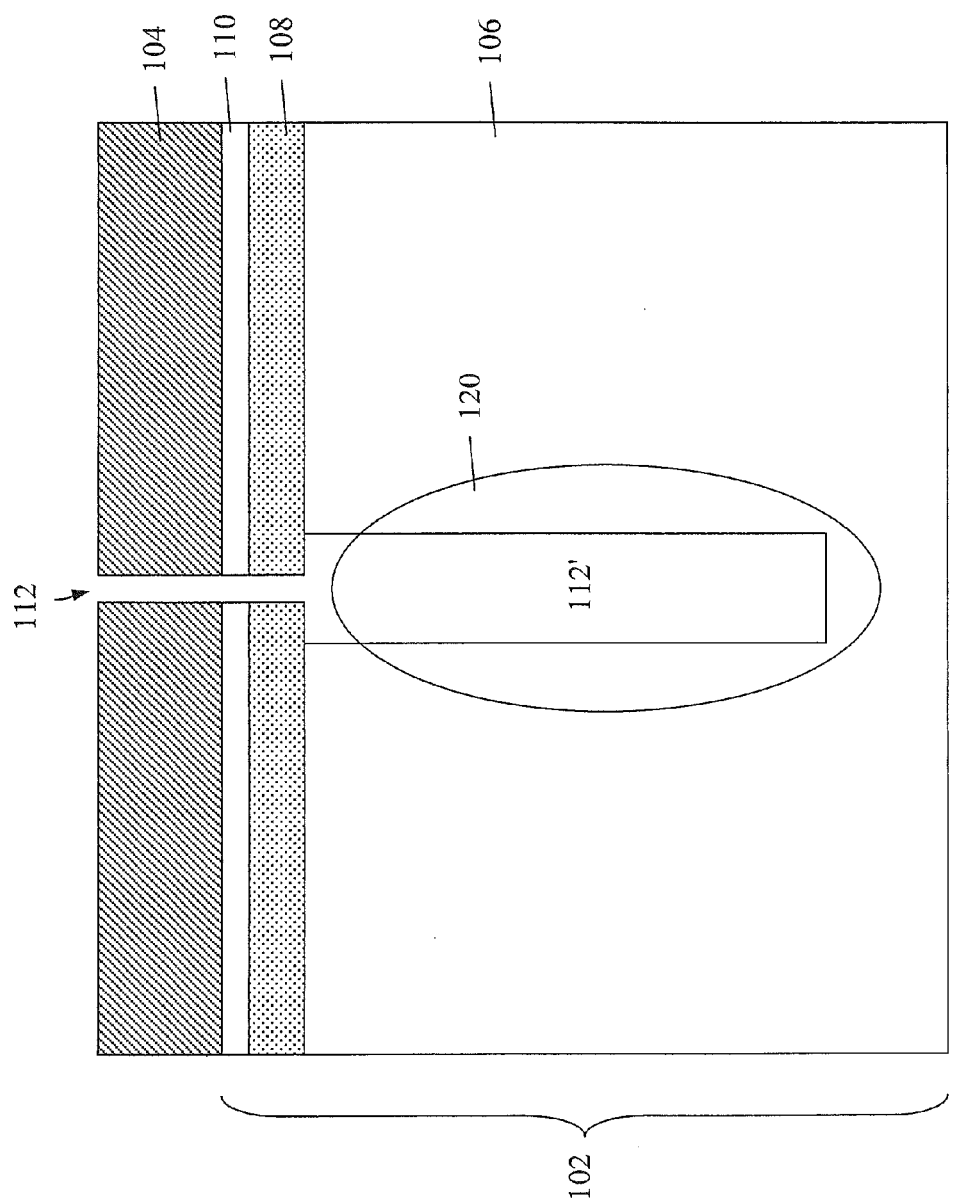
FIG. 12 illustrates an optional trench bottling process to widen the diameter of the deep trench.

Finally, FIG. 12 illustrates an optional trench bottling process to widen the diameter of the deep trench. In one embodiment, the deep trench 112 may be widened post-anneal in the bottom semiconductor layer 106 to form widened portion 112', using an etch chemistry selective to the doped region 120.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of forming a deep trench structure for a semiconductor device, the method comprising:
   forming a mask layer over a semiconductor substrate;
   forming an opening in the mask layer by patterning the mask layer;
   forming a deep trench in the semiconductor substrate using the patterned opening in the mask layer;
   forming a sacrificial fill material over the mask layer and into the deep trench;
   recessing a first portion of the sacrificial fill material from the deep trench and performing a first dopant implant to form a first doped region in the semiconductor substrate; and
   recessing a second portion of the sacrificial fill material from the deep trench and performing a second dopant implant to form a second doped region in the semiconductor substrate, wherein the second doped region is formed underneath the first doped region such that the second doped region and the first doped region are contiguous with each other.

2. The method of claim 1, further comprising forming a spacer material on sidewall and bottom surfaces of the deep trench prior to forming the sacrificial fill material.

3. The method of claim 1, wherein the sacrificial fill material comprises one or more of a photoresist and an organic planarization layer (OPL).

4. The method of claim 1, further comprising recessing a third portion of the sacrificial fill material from the deep trench and performing a third dopant implant to form a third doped region in the semiconductor substrate, wherein the third doped region is formed underneath the second doped region such that the third doped region and the second doped region are contiguous with each other.

5. The method of claim 1, further comprising annealing the semiconductor substrate to create a single contiguous doped region with a smoothed dopant profile.

6. The method of claim 5, wherein the single contiguous doped region forms a buried plate of a deep trench capacitor structure.

7. The method of claim 1, wherein the semiconductor substrate is a semiconductor-on-insulator (SOI) substrate including a bottom semiconductor layer, a buried insulator layer, and a top semiconductor layer, and wherein the first and second doped regions are formed in the bottom semiconductor layer.

8. The method of claim 7, wherein the bottom semiconductor layer comprises a semiconductor material is selected from silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials.

9. The method of claim 7, wherein the mask layer has a thickness sufficient to prevent implantation of the dopant ions into the top semiconductor layer.

10. The method of claim 7, wherein the mask layer has a thickness greater than a distance between a top surface of the bottom semiconductor layer and a bottommost point of the first doped region.

11. A method of forming a deep trench structure for a semiconductor device, the method comprising:
    forming a mask layer over a semiconductor-on-insulator (SOI) substrate having a bottom semiconductor layer, a buried insulator layer on the bottom semiconductor layer, and a top semiconductor layer on the buried insulator layer;
    forming an opening in the mask layer by patterning the mask layer;
    forming a deep trench in the SOI substrate using the patterned opening in the mask layer;
    forming a sacrificial fill material over the mask layer and into the deep trench;
    recessing a first portion of the sacrificial fill material from the deep trench and performing a first dopant implant to form a first doped region in the bottom semiconductor layer of the SOI substrate;
    recessing a second portion of the sacrificial fill material from the deep trench and performing a second dopant implant to form a second doped region in the bottom semiconductor layer, wherein the second doped region is formed underneath the first doped region such that the second doped region and the first doped region are contiguous with each other; and
    annealing the semiconductor SOI to create a single contiguous doped region with a smoothed dopant profile.

12. The method of claim 11, further comprising forming a spacer material on sidewall and bottom surfaces of the deep trench prior to forming the sacrificial fill material so as to protect the top semiconductor layer from the dopant implants.

13. The method of claim 11, wherein the sacrificial fill material comprises one or more of a photoresist and an organic planarization layer (OPL).

14. The method of claim 11, further comprising recessing a third portion of the sacrificial fill material from the deep trench and performing a third dopant implant to form a third doped region in the bottom semiconductor layer, wherein the third doped region is formed underneath the second doped region such that the third doped region and the second doped region are contiguous with each other.

15. The method of claim 11, wherein the recessing of a $n^{th}$ portion of the sacrificial fill material is to a level above a lowest point of an $n^{th}$-doped region, where n is an integer.

16. The method of claim 15, wherein the recessing of a $n^{th}$ portion of the sacrificial fill material corresponds to a distance from about 500 nm to about 2000 nm.

17. The method of claim 11, wherein the single contiguous doped region forms a buried plate of a deep trench capacitor structure.

18. The method of claim 17, wherein the bottom semiconductor layer comprises a semiconductor material is selected from silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials.

19. The method of claim 17, wherein the mask layer has a thickness sufficient to prevent implantation of the dopant ions into the top semiconductor layer.

20. The method of claim 17, wherein the mask layer has a thickness greater than a distance between a top surface of the bottom semiconductor layer and a bottommost point of the first doped region.

* * * * *